US009529062B2

(12) United States Patent
Iyer et al.

(10) Patent No.: US 9,529,062 B2
(45) Date of Patent: Dec. 27, 2016

(54) METAMATERIAL LINERS FOR HIGH-FIELD-STRENGTH TRAVELING-WAVE MAGNETIC RESONANCE IMAGING

(71) Applicants: The Governors of the University of Alberta, Edmonton (CA); Alberta Health Services, Edmonton (CA)

(72) Inventors: Ashwin Iyer, Edmonton (CA); Justin Pollock, Edmonton (CA); Nicola de Zanche, Edmonton (CA)

(73) Assignees: The Governors of the University of Alberta, Edmonton (CA); Alberta Health Services, Edmonton (CA)

( * ) Notice: Subject to any disclaimer, the term of this patent is extended or adjusted under 35 U.S.C. 154(b) by 947 days.

(21) Appl. No.: 13/757,459

(22) Filed: Feb. 1, 2013

(65) Prior Publication Data

US 2013/0200897 A1    Aug. 8, 2013

Related U.S. Application Data

(60) Provisional application No. 61/594,608, filed on Feb. 3, 2012.

(51) Int. Cl.
*G01V 3/00* (2006.01)
*G01R 33/28* (2006.01)
*H01P 11/00* (2006.01)
*G01R 33/48* (2006.01)

(52) U.S. Cl.
CPC ........... *G01R 33/28* (2013.01); *G01R 33/4802* (2013.01); *H01P 11/00* (2013.01); *Y10T 29/49016* (2015.01)

(58) Field of Classification Search
CPC .................................................. G01R 33/4802
USPC .................................. 324/309, 307, 318, 322
See application file for complete search history.

(56) References Cited

U.S. PATENT DOCUMENTS

| | | |
|---|---|---|
| 6,791,432 B2 | 9/2004 | Smith et al. |
| 6,859,114 B2 | 2/2005 | Eleftheriades et al. |
| 6,927,574 B2 | 8/2005 | Young et al. |
| 7,218,190 B2 | 5/2007 | Engheta et al. |
| 7,532,008 B2 | 5/2009 | Pendry et al. |
| 7,580,604 B2 | 8/2009 | D'Aguanno et al. |
| 7,683,444 B2 | 3/2010 | Tonucci |
| 7,864,114 B2 | 1/2011 | Sanada |

(Continued)

OTHER PUBLICATIONS

Erni, D., "Highly Adaptive RF Excitation Scheme Based on Conformal Resonant CRLH Metamaterial Ring Antennas for 7-Tesla Traveling-Wave Magnetic Resonance Imaging", Proceedings of the 33rd Annual International Conference of the IEEE EMBS, Boston, Massachusetts (Aug. 30-Sep. 3, 2011), 554-558.

(Continued)

*Primary Examiner* — Louis Arana
(74) *Attorney, Agent, or Firm* — Seed IP Law Group LLP (57) ABSTRACT

A liner for a bore of a waveguide is provided. The liner as an aperture passing through it and is formed of a metamaterial that has a relative electrical permittivity that is negative and near zero. When the liner is installed in the waveguide, it lowers the cutoff frequency of the waveguide while allowing the waveguide to remain hollow. This liner can be used in the bore of an MRI machine to lower the cutoff frequency of the bore of the MRI machine to allow the MRI machine to operate using waves having a lower frequency that if the liner was not used.

26 Claims, 8 Drawing Sheets

(56) References Cited

U.S. PATENT DOCUMENTS

| | | | |
|---|---|---|---|
| 8,072,386 | B2 | 12/2011 | Lier et al. |
| 8,466,370 | B2 | 6/2013 | Lier |
| 8,587,469 | B2* | 11/2013 | Bruno .................. G01S 7/36 342/16 |
| 2009/0310926 | A1 | 12/2009 | D'Aguanno et al. |
| 2010/0078203 | A1 | 4/2010 | Lier |
| 2010/0156573 | A1 | 6/2010 | Smith et al. |
| 2011/0115486 | A1 | 5/2011 | Frohlich et al. |
| 2011/0204891 | A1* | 8/2011 | Drake .................. G01N 24/084 324/309 |
| 2012/0105970 | A1* | 5/2012 | Ueda .................. G02B 1/002 359/642 |
| 2013/0082710 | A1* | 4/2013 | Tropp .................. G01R 33/345 324/322 |
| 2013/0154902 | A1 | 6/2013 | Liu et al. |

OTHER PUBLICATIONS

Freire, M.J., et al., "On the applications of µ=-1 metamaterial lenses for magnetic resonance imaging", 2009 [retrieved on Oct. 28, 2013]. Retrieved from the Internet: <URL: http://arxiv.org/ftp/arxiv/papers/0909/0909.0550.pdf>, 21 p.

"Metamaterial," Wikipedia, the free encyclopedia, retrieved from https://en.wikipedia.org/wiki/Metamaterial, on Feb. 21, 2016, 15 pages.

Aguanno et al., "TE and TM guided modes in an air waveguide with negative-index-material cladding," *Physical Review E* 71:046603, 2005, 7 pages.

Alt et al., "Coaxial Waveguide MRI,"*Magnetic Resonance in Medicine* 67:1173-1182, 2012.

Alù et al., "Coaxial-to-Waveguide Matching With ϵ-Near-Zero Ultranarrow Channels and Bends," *IEEE Transactions on Antennas and Propagation* 58(2):328-339, 2010.

Alù et al., "Dielectric sensing in ϵ-near-zero narrow waveguide channels," *Physical Review B* 78:045102, 2008, 5 pages.

Alù et al., "Guided Modes in a Waveguide Filled With a Pair of Single-Negative (SNG), Double-Negative (DNG), and/or Double-Positive (DPS) Layers," *IEEE Transactions on Microwave Theory and Techniques* 52(1):199-210, 2004.

Baladi et al., "New approach for extraordinary transmission through an array of subwavelength apertures using thin ENNZ metamaterial liners," *Optics Express* 23(16):20356-20365, 2015.

Baqir et al., "Electromagnetic Fields in a Circular Waveguide Containing Chiral Nihility Metamaterial," *Progress in Electromagnetics Research M* 16:85-93, 2011.

Boltasseva et al., "Fabrication of optical negative-index metamaterials: Recent advances and outlook,"*Metamaterials* 2:1-17, 2008.

Brand, "Dispersion relations for cylindrical waveguides with metamaterial linings," *International Journal of Electronics* 96(1):99-107, 2009.

Brunner et al., "Traveling-Wave RF Shimming and Parallel MRI," *Magnetic Resonance in Medicine* 66:290-300, 2011.

Duan et al., "Experimental Demonstration of Double-Negative Metamaterials Partially Filled in a Circular Waveguide," *Progress in Electromagnetics Research* 121:215-224, 2011.

Duan et al., "Research Progress in Reversed Cherenkov Radiation in Double-Negative Metamaterials," *Progress in Electromagnetics Research* 90:75-87, 2009.

Edwards et al., "Experimental Verification of Epsilon-Near-Zero Metamaterial Coupling and Energy Squeezing Using a Microwave Waveguide," *Physical Review Letters* 100(3):033903, 2008, 4 pages.

Engheta, "An Idea for Thin Subwavelength Cavity Resonators Using Metamaterials With Negative Permittivity and Permeability," *IEEE Antennas and Wireless Propagation Letters* 1:10-13, 2002.

Erni et al., "Highly Adaptive RF Excitation Scheme Based on Conformal Resonant CRLH Metamaterial Ring Antennas for 7-Tesla Traveling-Wave Magnetic Resonance Imaging," 33rd Annual International Conference of the IEEE EMBS, Boston, Mass., Aug. 30-Sep. 3, 2011, 5 pages.

Freire et al., "Experimental demonstration of a µ =-1 metamaterial lens for magnetic resonance imaging," *Applied Physics Letters* 93:231108, 2008, 4 pages.

Halterman et al., "Characteristics of bound modes in coupled dielectric waveguides containing negative index media," *Optics Express* 11(6):521-529, 2003.

He et al., "Slow light in a dielectric waveguide with negative-refractive-index photonic crystal cladding," *Optics Express* 16(15):11077-11082, 2008.

He et al., "Slow Propagation of Electromagnetic Waves in a Dielectric Slab Waveguide With a Left-Handed Material Substrate," *IEEE Microwave and Wireless Components Letters* 16(2):96-98, 2005.

Hrabar et al., "Application of Wire-based Metamaterials for Antenna Miniaturization," 3rd European Conference on Antennas and Propagation, Berlin, Germany, Mar. 23-27, 2009, 4 pages.

Hrabar et al., "Waveguide Miniaturization Using Uniaxial Negative Permeability Metamaterial," *IEEE Transactions on Antennas and Propagation* 53(1):110-119, 2005.

Kamli et al., "Coherent Control of Low Loss Surface Polaritons," *Physical Review Letters* 101:263601, 2008, 4 pages.

Kim, "Comparative Analysis of Guided Modal Properties of Double-Positive and Double-Negative Metamaterial Slab Waveguides," *Radioengineering* 18(2):117-123, 2009.

Kim, "Fundamental guided electromagnetic dispersion characteristics in lossless dispersive metamaterial clad circular air-hole waveguides," *J. Opt. A: Pure Appl. Opt.* 9:1062-1069, 2007.

Lavoie, "Slow Light in Metamaterial Waveguides," *A Thesis Submitted to the Faculty of Graduate Studies in Partial Fulfillment of the Requirements for the Degree of Doctor of Philosophy, Department of Physics and Astronomy, University of Calgary*, 2013, 185 pages.

Lier, "Review of Soft and Hard Horn Antennas, Including Metamaterial-Based Hybrid-Mode Horns," *IEEE Antennas and Propagation Magazine* 52(2):31-39, 2010.

Litchinitser et al., "Metamaterials: electromagnetic enhancement at zero-index transition," *Optics Letters* 33(20):2350-2352, 2008.

Meng et al., "Controllable Metamaterial-Loaded Waveguides Supporting Backward and Forward Waves," *IEEE Transactions on Antennas and Propagation* 59(9):3400-3411, 2011.

Moiseev et al., "Low-loss nonlinear polaritonics," *Physical Review A* 81:033839, 2010, 5 pages.

Nefedov et al., "Waveguide containing a backward-wave slab," *Radio Science* 38(6):1101, 2003, 9 pages.

Ozgun et al., "Utilization of Anisotropic Metamaterial Layers in Waveguide Miniaturization and Transitions," *IEEE Microwave and Wireless Components Letters* 17(11):754-756, 2007.

Pollock et al., "Analysis of Propagation in Metamaterial-Lined Circular Waveguides," IEEE International Symposium on Antennas and Propagation and USNC-URSI National Radio Science Meeting, Orlando, Florida, Jul. 7-13, 2013, 2 pages.

Pollock et al., "Below-Cutoff Propagation in Metamaterial-Lined Circular Waveguides," *IEEE Transactions on Microwave Theory and Techniques* 61(9):3169-3178, 2013.

Pollock et al., "Cylindrical Free-Space Transmission-Line Metamaterials: A Numerical Study," *Special Cluster on Metamaterials of IEEE Antennas Wireless Propagation Letters*, 2012, 3 pages.

Pollock et al., "Cylindrical Free-Space Transmission-Line Metamaterials: A Numerical Study," *Proceedings of Metamaterials ' 2011: The Fifth International Congress on Advanced Electromagnetic Materials in Microwaves and Optics*, Barcelona, Spain, Oct. 10-15, 2011, pp. 30-32. (2 pages).

Pollock et al., "Effective-Medium Properties of Cylindrical Transmission-Line Metamaterials," *IEEE Antennas and Wireless Propagation Letters* 10:1491-1494, 2011.

Pollock et al., "Miniaturized Circular Waveguide Probe Antennas Using ENNZ Metamaterial Liners," IEEE International Symposium on Antennas and Propagation and USNC-URSI Radio Science Meeting, Memphis, Tennessee, Jul. 6-11, 2014, 2 pages.

(56) References Cited

OTHER PUBLICATIONS

Pollock et al., "Miniaturized Circular-Waveguide Probe Antennas Using Metamaterial Liners,", *IEEE Transactions on Antennas and Propagation* 63(1):428-433, 2015.

Pollock et al., "Multilayer Cylindrical Transmission-Line Metamaterials and their Applications in Imaging and Antenna Beamforming," IEEE International Symposium on Antennas and Propagation and USNC/URSI National Radio Science Meeting, Spokane, Washington, Jul. 3-8, 2011, Abstract, 1 page.

Pollock et al., "Multilayer Cylindrical Transmission-Line Metamaterials and their Applications in Imaging and Antenna Beamforming," slides for a presentation given at the IEEE International Symposium on Antennas and Propagation and USNC/URSI National Radio Science Meeting, Spokane, Washington, Jul. 3-8, 2011, 31 pages.

Pollock et al., "Radiation Characteristics of Miniaturized Metamaterial-Lined Waveguide Probe Antennas," IEEE International Symposium on Antennas and Propagation and North American Radio Science Meeting, Vancouver, BC, Canada, Jul. 19-24, 2015, 2 pages.

Pollock et al., "Realization of $\epsilon$-negative-near-zero Metamaterial Liners for Circular Waveguides," Applied Electromagnetics Conference (AEMC), 2013 IEEE, Bhubaneswar, India, Dec. 18-20, 2013, 2 pages.

Pollock et al., "Traveling-Wave MRI at Lower $B_0$ Field Strengths Using Metamaterial Liners," 20th Annual Meeting & Exhibition of the International Society for Magnetic Resonance in Medicine, Melbourne, Australia, May 5-11, 2012, 1 page.

Pratap et al., "Anisotropic metamaterial optical fibers," *Optics Express* 23(7):9074-9085, 2015.

Qing et al., "Nanoscale optical waveguides with negative dielectric claddings," *Physical Review B* 71:153107, 2005, 4 pages.

Radu et al., "Numerical and Experimental Analysis of a Wire Medium Collimator for Magnetic Resonance Imaging," *Electromagnetics* 28(7):531-543, 2008.

Rao, "Propagation characteristics of a circular waveguide coated inside with a metamaterial," *International Journal of Electronics* 94(10): 935-942, 2007.

Shadrivov et al., "Guided modes in negative-refractive-index waveguides," *Physical Review E* 67:057602, 2003, 4 pages.

Shamonina et al., "Magneto-inductive waveguide," *Electronics Letters* 38(8):371-373, 2002.

Silveirinha et al., "Tunneling of Electromagnetic Energy through Subwavelength Channels and Bends using $\epsilon$-Near-Zero Materials," *Physical Review Letters* 97:157403, 2006, 4 pages.

Tan et al., "A Performance Comparison of a Ku-Band Conical Horn with an Inserted Cone-Sphere with Horns with an Integrated Dielectric Lens and Metamaterial Loading," *IEEE Antennas and Propagation Magazine* 53(5):1115-122, 2011.

Tassin et al., "A comparison of graphene, superconductors and metals as conductors for metamaterials and plasmonics," *Nature Photonics* 6:259-264, 2012.

Wang et al., "Guided modes in slab waveguides with a left handed material cover or substrate," *Optics Communications* 281:607-613, 2008.

Wang et al., Analysis of Guided Modes in Asymmetric Left-Handed Slab Waveguides, *Progress in Electromagnetics Research* 62:203-215, 2006.

Wiltshire et al., "Microstructured Magnetic Materials for RF Flux Guides in Magnetic Resonance Imaging," *Science* 291:849-851, 2001.

Xiao et al., "Yellow-light negative-index metamaterials," *Optics Letters* 34(22):3478-3479, 2009.

Xie et al., "Proposal of Cylindrical Rolled-Up Metamaterial Lenses for Magnetic Resonance Imaging Application and Preliminary Experimental Demonstrations," *Progress in Electromagnetics Research* 124:151-162, 2012.

Zhou et al., "An efficient way to reduce losses of left-handed metamaterials," *Optics Express* 16(15):11147-11152, 2008.

* cited by examiner

Fig. 1

$\varepsilon(\omega_o)<0 \quad \mu(\omega_o)<0$

| | | |
|---|---|---|
| $\varepsilon_r = -0.5$ | $\varepsilon_r = 0.5$ | No Liner |
| $H_{max} = 0.92$ mA/m<br>Variation=61% | $H_{max} = 2.27$ mA/m<br>Variation=151% | $H_{max} = 3.09$ mA/m<br>Variation=206% |

METAMATERIAL LINERS FOR HIGH-FIELD-STRENGTH TRAVELING-WAVE MAGNETIC RESONANCE IMAGING

CLAIM OF PRIORITY

This application claims the benefit of priority under 35 U.S.C. §119(e) of U.S. Provisional Patent Application Ser. No. 61/594,608, filed on Feb. 3, 2012, which prior application is incorporated by reference herein in its entirety.

The present invention relates to a liner for waveguides and more particularly to a liner for a waveguide that is formed from a metamaterial and can lower the cutoff frequency of the waveguide.

BACKGROUND

Magnetic resonance imaging (MRI) is a medical imaging technology that is used to visualize detailed internal structures inside a patient's body. MRI machines use the principle of nuclear magnetic resonance to image tissues in a patient's body. First, a strong static magnetic field is used to align the magnetization of hydrogen nuclei (protons) in the body and the strength of this field establishes a resonance frequency of the aligned protons known as the Larmor frequency. A radio frequency (RF) electromagnetic field can then be applied to alter the alignment of the magnetization. By applying the RF electromagnetic field at the Larmor frequency, energy can be efficiently transferred to the aligned protons, changing the way in which they spin. Once the RF electromagnetic field is removed, the protons return to their initial spin state, releasing energy which is then interpreted spatially for the purposes of imaging.

MRI machines are especially good at contrasting the different soft tissues in a patient's body and are therefore very useful in imaging the brain, muscles, etc.

There are a number of different types of MRI machines. Traditional MRI machines operate at static magnetic field strengths that produce Larmor frequencies in the range of tens of Megahertz (MHz). These types of MRI machines operate on the principle of near-field coupling with the detector being placed as close as possible to the patient in the MRI machine and create stationary (i.e. nonpropagating) RF fields. Typically, these types of MRI machines use static magnetic fields having a field strength of 1.5 T which results in a Larmor wavelength of approximately 5 m.

More recently high-field (HF) MRI machines have been used that use higher frequencies and result in higher signal- and contrast-to-noise ratios, allowing for higher-resolution imaging than what can be accomplished using traditional MRI machines. Whereas traditional MRI machines operate at field strengths that produce Larmor frequencies in the range of tens of Megahertz (MHz), HF MRI uses magnetic field strengths that are higher than those of traditional MRI, resulting in Larmor frequencies in the range of hundreds of MHz.

In both traditional MRI machines and HF MRI machines, imaging is accomplished by using transmit/detect coils that generate/detect the required RF fields. The problem with this method is that these coils must be placed very near to the patient being imaged. Typically, the coils are placed around the inside of the bore of the MRI machine so that these coils are adjacent to and surrounding the patient. This closeness of the coils and the confined space the coils create can make patients uncomfortable. Recently a new type of MRI technology has been developed called travelling wave (TW) MM that addresses some of these issues. TW MRI machines use propagating electromagnetic waves passing through the bore of the TW MRI to obtain the images of the patient. Rather than having to place transmit/detect coils beside the body of a patient, TW MRI uses waves that are excited by RF antennas placed at either end of the TW MRI bore. This allows all of the hardware for generating and detecting these waves to be placed away from where the patient is when the TW MRI is in operation.

In TW MRI machines, the bore of the MRI acts a cylindrical waveguide for the electromagnetic waves propagating through them. The electromagnetic waves propagating through a cylindrical waveguide may be classified into modes, such as the Transverse Electric (TE) modes, and by mode indices (e.g. 11), which identify the way in which the modal fields vary in the transverse waveguide plane. These electromagnetic waves propagate through the bore of the MRI using the conductive inner surface of the bore. Like a waveguide, the TW MRI bore has a cutoff frequency for propagating waves, and because of the size of bore required to accommodate the body of the patient, this cutoff frequency is in the order of several hundred MHz. For example, a typical MRI bore may be 58 cm in diameter and have a natural frequency cutoff of the $TE_{11}$ mode of approximately 300 MHz. This natural cutoff frequency of the MRI bore prevents waves having a frequency below the natural cutoff frequency from propagating through the MRI bore. This requires TW MRI bores to have larger magnets and create strong enough magnetic fields that the generated waves have a frequency greater than the natural cutoff frequency of the MRI bore. It also prevents more traditional MRI machines from being used as TW MRI machines because they do not possess strong enough magnets to generate waves that have a frequency greater than the natural cutoff frequency of the MRI bore.

SUMMARY OF THE INVENTION

In a first aspect, a liner for a bore of an MRI machine is provided. The liner can have a body with an annular shape and formed of a metamaterial having a relative electrical permittivity that is negative and near zero.

In another aspect, a liner for a bore of a waveguide is provided. The liner has a body having an aperture defined therein and formed of a metamaterial having a relative electrical permittivity that is negative and near zero.

In another aspect, a method of lowering the cutoff frequency of a waveguide is provided. The method comprises: providing a liner formed of metamaterial having a relative electrical permittivity of negative and near zero value; and inserting the liner in the waveguide.

The liner renders the volume of the waveguide inhomogeneous filled, and the supported electromagnetic modes are described as hybrid modes. For example, the hybrid-mode counterpart of the $TE_{11}$ mode is referred to as the $HE_{11}$ mode. When the liner is thin, the $HE_{11}$ modal fields in the inhomogeneously filled volume resemble those of the $TE_{11}$ modal fields in the homogeneously filled (empty) volume.

DESCRIPTION OF THE DRAWINGS

A preferred embodiment of the present invention is described below with reference to the accompanying drawings, in which.

DETAILED DESCRIPTION OF THE ILLUSTRATED EMBODIMENTS

Figure 1:
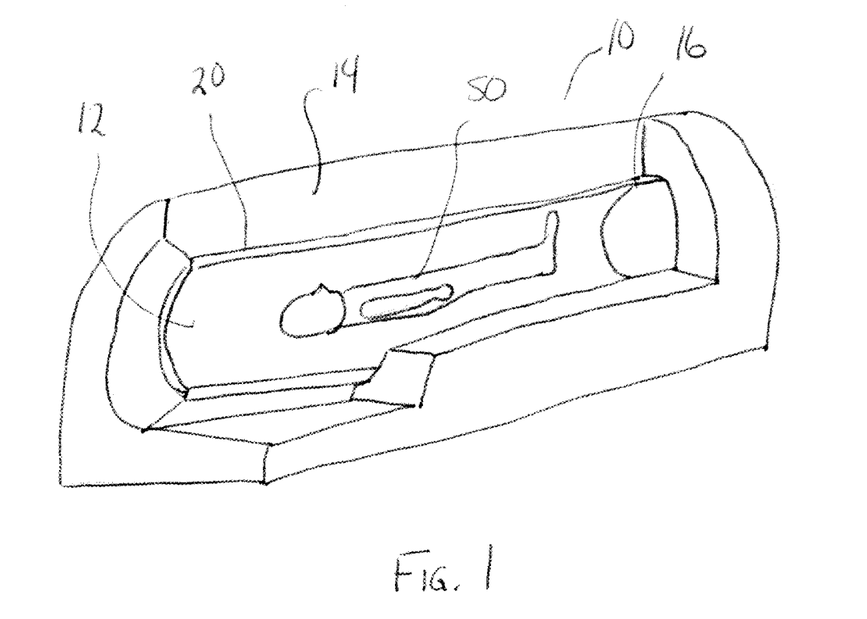
FIG. 1 is a schematic illustration of a traveling wave (TW) magnetic resonance imaging (MRI) machine.

FIG. 1 illustrates a travelling wave (TW) magnetic resonance imaging (MRI) device 10 for creating images of the internal structures of a patient 50 placed in the TW MRI device 10. The TW MRI device 10 can have a bore 12 which can hold the patient 50. An MRI magnet 14 surrounds the bore 12. Radio frequency (RF) waves can be generated by the TW MRI machine 10 and these waves will travel along the length of the bore 12 which acts as a waveguide. These waves can be detected by an antenna 16 placed at one end of the bore 12 to create the images of the patient 50.

The bore 12 is a waveguide and is subject to a natural cutoff frequency. This cutoff frequency is the lowest frequency at which waves can propagate through the bore 12 of the waveguide. In order for a wave to propagate through the bore 12, it must have a frequency greater than the natural cutoff frequency of the bore 12.

A liner 20 having a body can be provided inside the bore 12 of the TW MRI device 10. The liner 20 can be annular in shape and have a thickness that is relatively thin in comparison to the diameter of the bore 12 of the TW MRI device 10. In one aspect, the thickness, t, of the liner 20 can be 2 cm, however, this thickness could be greater or smaller. Ideally, the thickness of the liner 20 should be as thin as possible so that the liner 20 narrows the bore 12 of the TW MRI device 10 as little as practical because the patient 50 still has to fit inside the bore 12 and the liner 20, yet still have enough thickness to provide the desired effect. In one aspect, the thickness of the liner 20 is chosen so that the diameter of the bore 12 is decreased by 10% or less when the liner 20 is inserted into the bore 12. In one aspect, the annular shaped liner 20 is sized to fit adjacent to an inside surface of the bore 12.

The liner 20 can be made of a metamaterial so that it can be imparted with specific properties. Metamaterials are artificial materials that can be engineered to possess properties that are unavailable in nature, such as extreme, negative or even near-zero values of relative electrical permittivity ($\epsilon$) and relative magnetic permeability ($\mu$). In the present case, the liner 20 can be formed from a metamaterial having a relative (i.e. with respect to free space) electric permittivity, $\epsilon$, that is both negative and near zero. Near zero means having a magnitude close to but not quite zero typically on the order of 1 and often much less. In one aspect, the relative electrical permittivity ($\epsilon$) can be in the range of −1 to −0.1 and in one aspect be substantially −0.1. In another aspect the relative electrical permittivity ($\epsilon$) could be −0.08.

By using a metamaterial with a relative electric permittivity ($\epsilon$) that is negative and near zero the liner 20 can: lower the cutoff frequency of the bore 12; support additional electromagnetic modes in the bore 12; and increase the uniformity of electric and magnetic fields in the bore 12.

The liner 20 can be made of any metamaterial that can provide the desired characteristics, but in one aspect, the liner 20 can be formed of negative-refractive-index transmission-line (NRI-TL) metamaterials. NRI-TL metamaterials are synthesized using materials and methods of the RF/microwave-circuit domain, such as printed-circuit boards consisting of substrates and metallic traces, and surface-mount or printed inductors and capacitors. These components are arranged at sub-wavelength intervals in a periodic fashion so as to produce exotic effective-medium properties.

Figure 2:
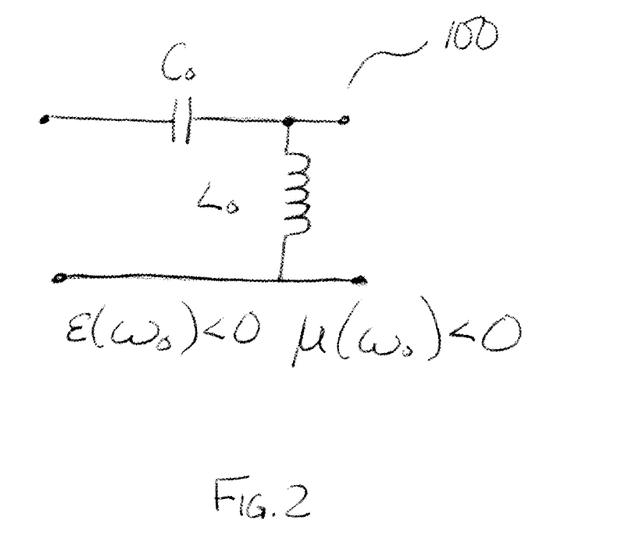
FIG. 2 is an illustration of an equivalent circuit configuration that can be used to create a metamaterial.
Figure 3:
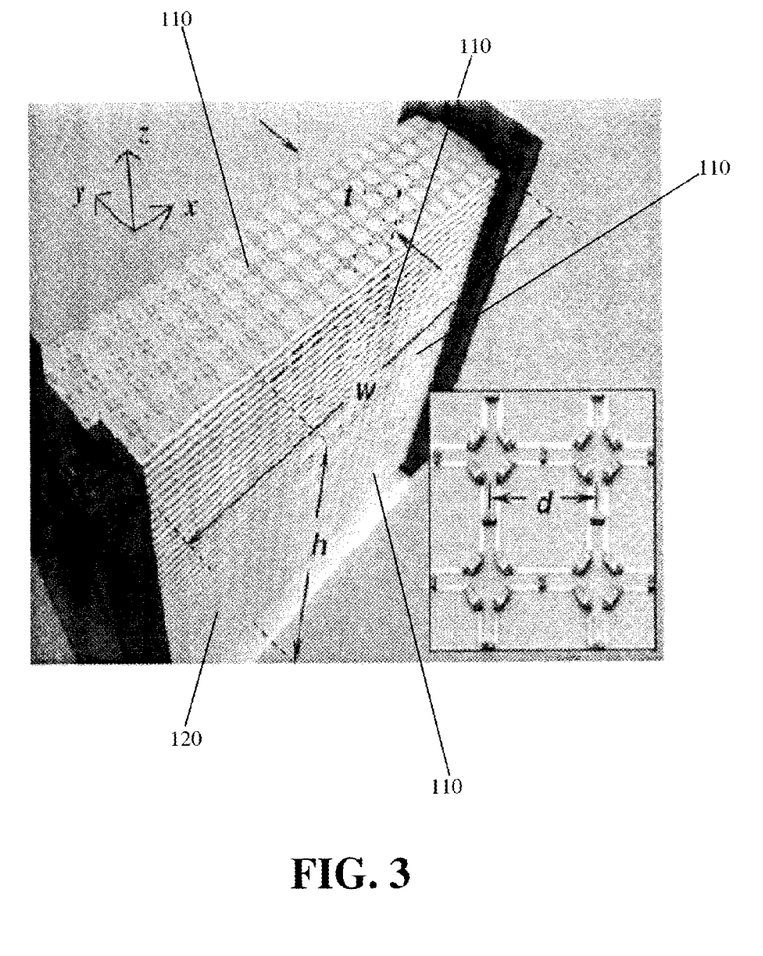
FIG. 3 is an illustration of stack of planar NRI-TL metamaterial layers.

FIG. 2 illustrates a circuit layout 100 that is used to form the metamaterial layer in one aspect. By repeating this circuit layout 100 periodically or quasi-periodically at a specific distance apart on a circuit board, a NRI-TL metamaterial layer can be formed. Referring to FIG. 3, the liner 20 can be given volume by stacking a number of NRI-TL metamaterial layers 110 to form a stack 120, which enables it to interact with waves generated by antennas in free space. The stack 120 of NRI-TL metamaterial layers 110 provide a height or volume to the metamaterial and can provide the thickness of the liner 20.

Figure 4:
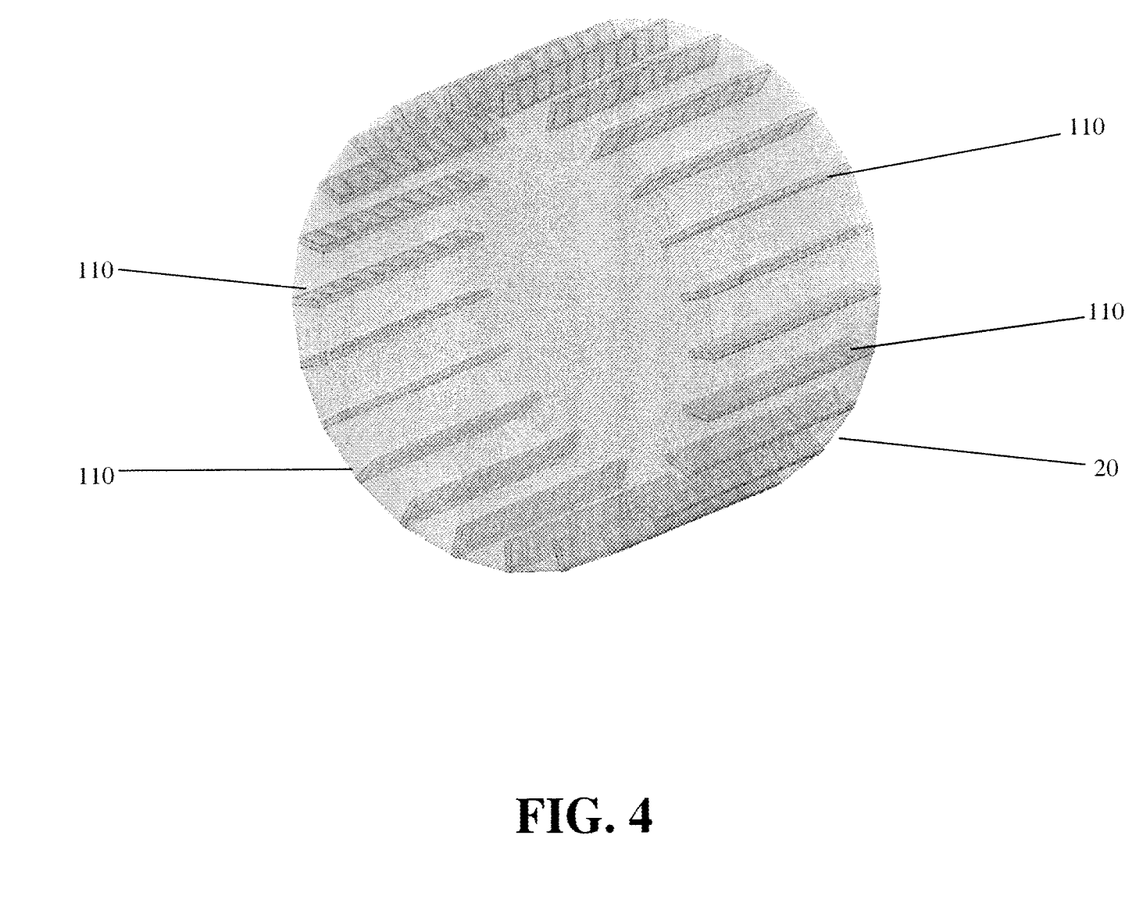
FIG. 4 is an illustration of the configuration of a metamaterial liner in one aspect.

FIG. 4 illustrates one configuration of stacks 120 of metamaterial layers to form the liner 20. In this aspect, the stacks 120 are positioned in radial orientation and arranged azimuthally in periodic fashion and extending the length of the bore 12 of the TW MRI device 10. The space between the stacks 120 is determined by the number of layers used to make up the stack 120. The number of unit cells constituting the radial extent of a single layer determines the thickness of the liner 20.

Figure 5:
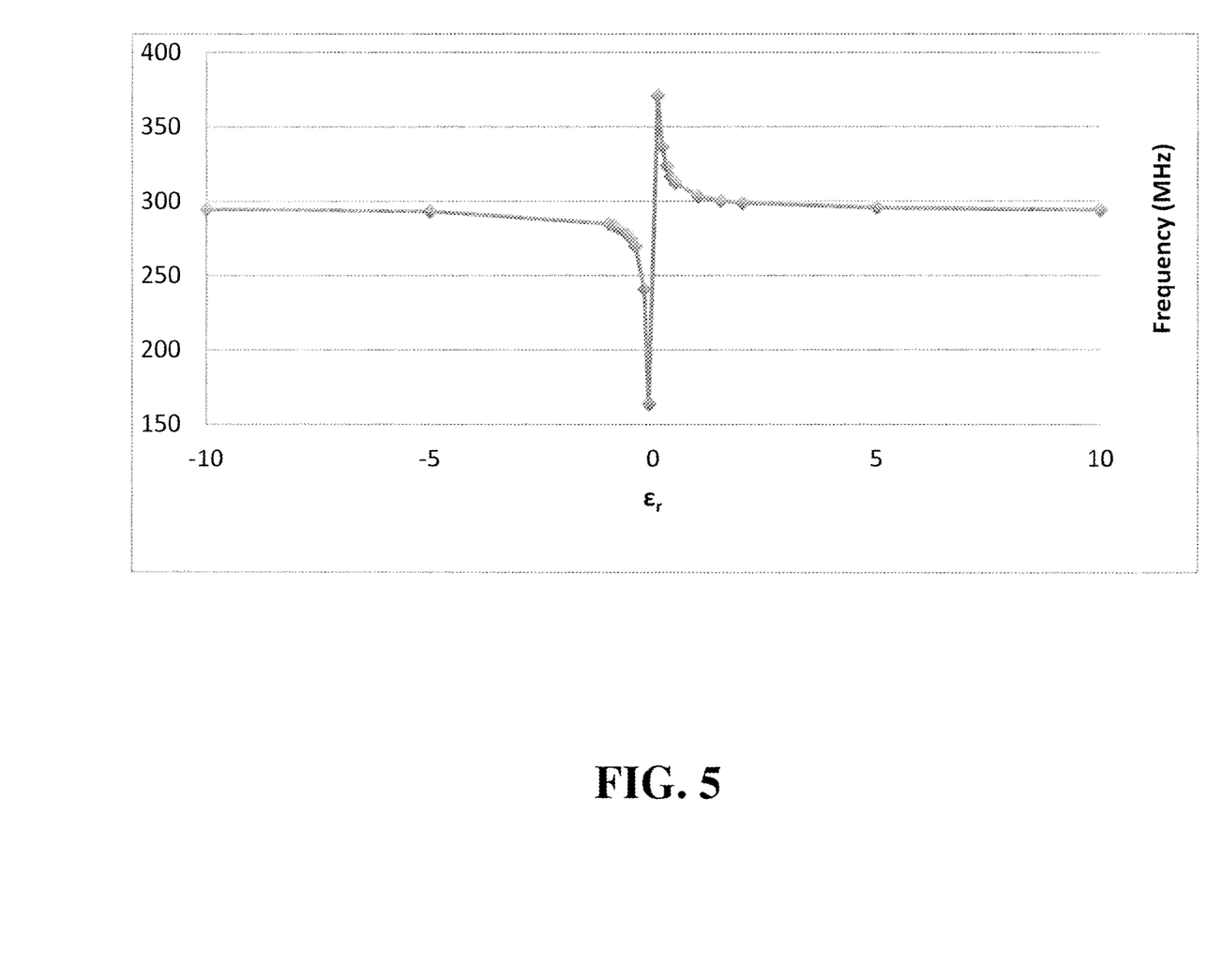
FIG. 5 is a graph of the cutoff frequency of a TW MRI bore containing a liner of relative electrical permittivity ($\epsilon$), versus the relative electrical permittivity of the liner.
Figure 6:
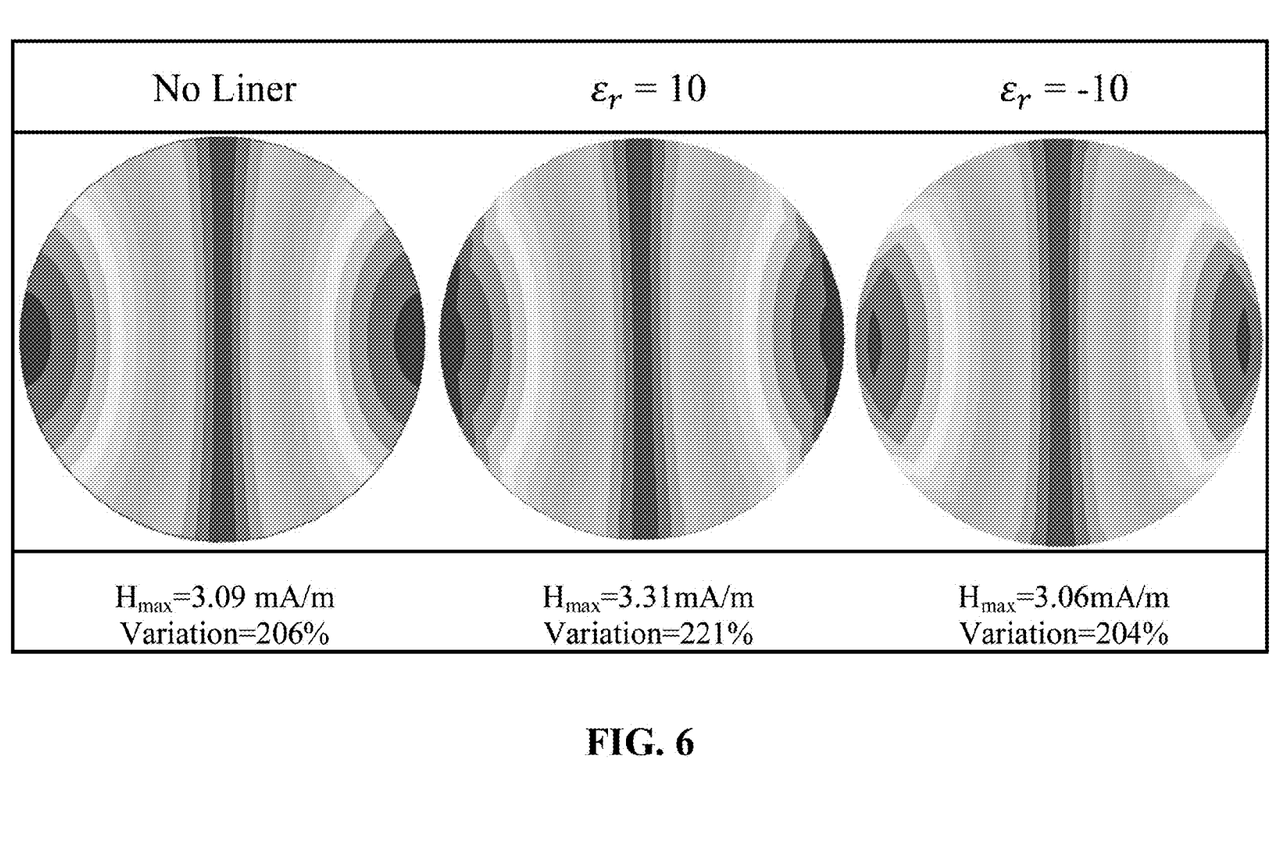
FIG. 6 is an illustration of the variation in the transverse magnetic field magnitude for $TE_{11}$ mode waves where there is no liner, for $HE_{11}$ mode waves where there is a liner having relative electrical permittivity of 10, and for $HE_{11}$ mode waves where there is a liner having relative electrical permittivity of −10.
Figure 7:
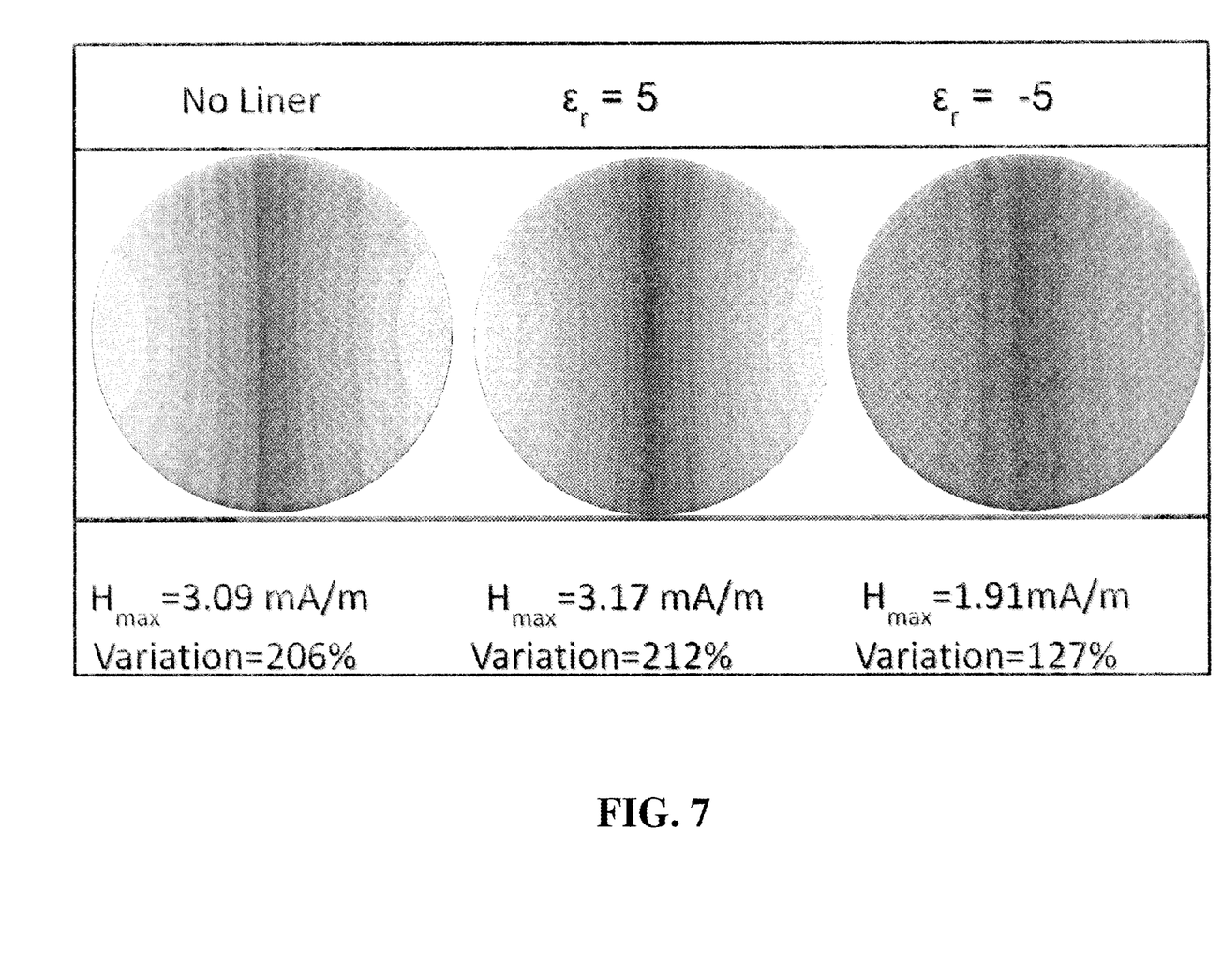
FIG. 7 is an illustration of the variation in the transverse magnetic field magnitude for $TE_{11}$ mode waves where there is no liner, for $HE_{11}$ mode waves where there is a liner having relative electrical permittivity of 5, and for $HE_{11}$ mode waves where there is a liner having relative electrical permittivity of −5.
Figure 8:
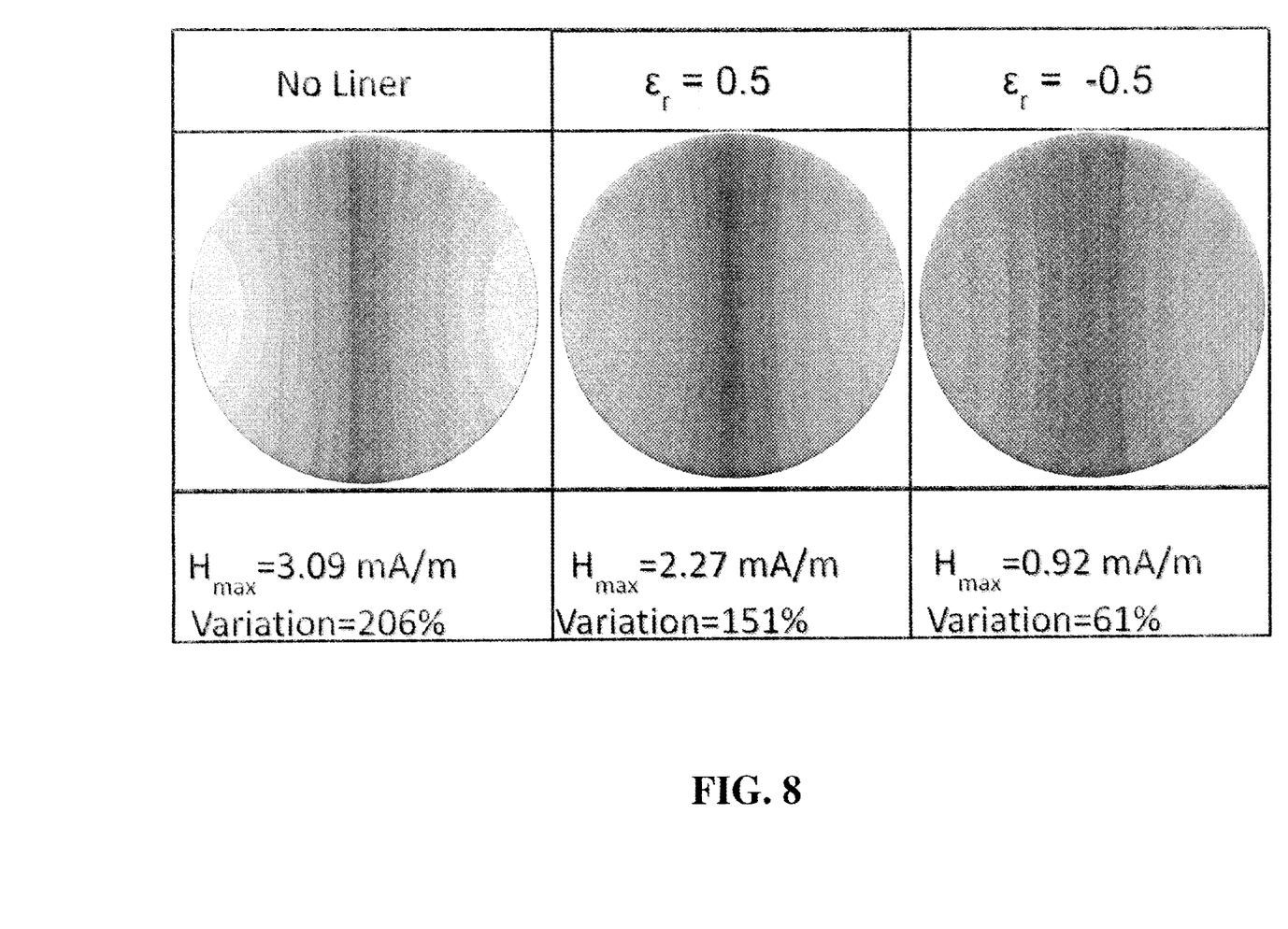
FIG. 8 is an illustration of the variation in the transverse magnetic field magnitude for $TE_{11}$ mode waves where there is no liner, for $HE_{11}$ mode waves where there is a liner having relative electrical permittivity of 0.5, and for $HE_{11}$ mode waves where there is a liner having relative electrical permittivity of −0.5.
Figure 9:
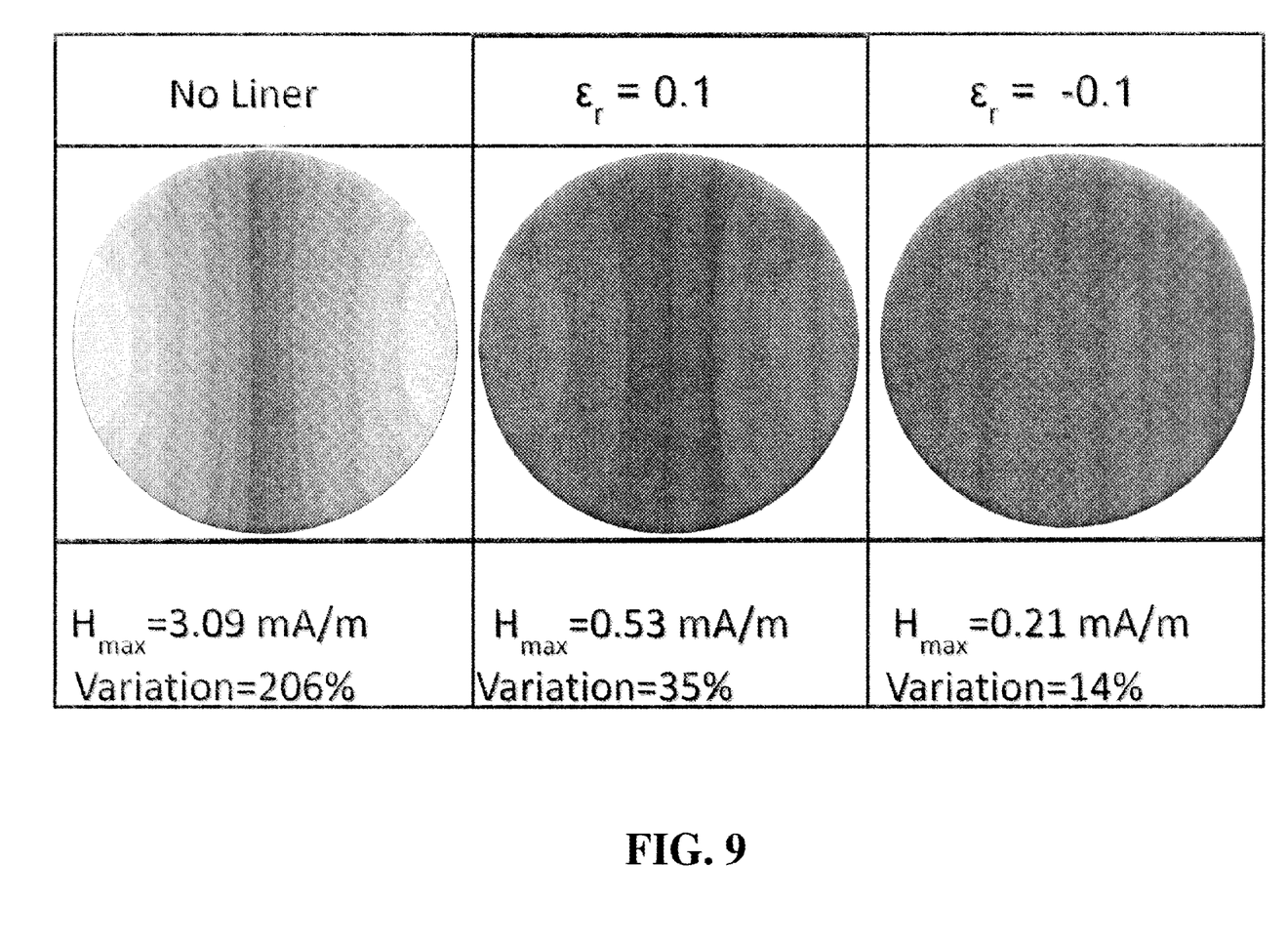
FIG. 9 is an illustration of the variation in the transverse magnetic field magnitude for $TE_{11}$ mode waves where there is no liner, for $HE_{11}$ mode waves where there is a liner having relative electrical permittivity of 0.1, and for $HE_{11}$ mode waves where there is a liner having relative electrical permittivity of −0.1.

By using a liner 20 in the bore 12 of a TW MRI device 10 it has been found that the cutoff frequency of the bore 12 can be decreased when the liner 20 has a relative electrical permittivity ($\epsilon$) that is negative and near zero. This decreased cutoff frequency corresponds to a so-called backward $HE_{11}$ mode, for which propagation is allowed for frequencies below, rather than above, the cutoff frequency. FIG. 5 illustrates a graph of the cutoff frequencies of a bore of a TW MRI machine having a 58 cm diameter plotted against the variations of relative electrical permittivity ($\epsilon$) of a 2 cm metamaterial liner lining the bore of the TW MRI machine for $HE_{11}$ mode RF waves. As can been seen from the graph, the cutoff frequency of the bore remains relatively constant at just below 300 MHz when the liner has large negative or positive relative electrical permittivity ($\epsilon$). As the relative electrical permittivity ($\epsilon$) nears zero on both the positive and negative side, the cutoff frequency of the bore is greatly affected. In the case of the liner having positive near zero relative electrical permittivity ($\epsilon$), the cutoff frequency of the bore increases above 300 MHz. However, as the relative electrical permittivity ($\epsilon$) nears zero on the negative side there is a point where there is a zero frequency cutoff.

The cutoff frequency is reduced to zero at a finite, negative, near-zero value of relative electrical permittivity $\epsilon_{MAX}$, which is given by the equation:

$$\varepsilon_{MAX} = \frac{1 - b^2/a^2}{1 + b^2/a^2} \quad (1)$$

where, a is the inner diameter of the lined bore 12, b is the outer diameter of the lined bore 12, and the liner 20 thickness is $$\frac{b-a}{2}.$$

However, to use a relative electrical permittivity ($\epsilon$) for the liner 20 that result in a zero frequency cutoff is impractical since it leads to zero $HE_{11}$ fields. Therefore, a relative electrical permittivity ($\epsilon$) for the liner 20 should be chosen that falls below the $\epsilon_{MAX}$ determined using equation (1). This will allow a practical (i.e., nonzero), reduced cutoff frequency supporting non-zero $HE_{11}$ fields to be established if the relative electrical permittivity ($\epsilon$) of the liner 20 is chosen to be more negative than $\epsilon_{max}$.

An approximate relationship between the reduced cutoff frequency $f_c$ and liner 20 permittivity ($\epsilon$) is:

$$f_c = \frac{\sqrt{2} c}{\pi a} \sqrt{\frac{1 - (\varepsilon_{TARGET}/\varepsilon_{MAX})}{1 - 3(\varepsilon_{TARTGET}/\varepsilon_{MAX})}} \quad (2)$$

where, a is the inner diameter of the lined bore 12, and c is the speed of light in vacuum. Using this equation a person can select a desired reduced cutoff frequency, $f_c$, and then use equation (2) with an $\epsilon_{MAX}$ determined using equation (1) to solve for the relative electrical permittivity $\epsilon_{TARGET}$. By then using a metamaterial for the liner 20 that has a relative electrical permittivity $\epsilon_{TARGET}$, the liner 20 will have the desired reduced cutoff frequency, $f_c$.

Typically, in order to have a reduced cutoff frequency, $f_c$, that is practical, the reduced cut-off frequency, $f_c$, of the liner 20 will be below 90% of the cutoff frequency of the unlined bore 12. To determine a relative electrical permittivity ($\epsilon$) that will result in a desired reduced cutoff frequency, $f_c$, below 90% of the cutoff frequency of the unlined bore 12 the following equation can be used:

$$\varepsilon_{min,90\%} = -22.27 \varepsilon_{MAX} = -22.27 \frac{1 - b^2/a^2}{1 + b^2/a^2} \quad (3)$$

where $\epsilon_{min,90\%}$ is the relative electrical permittivity ($\epsilon$) corresponding to a frequency cutoff reduced to 90% of the frequency cut-off of the unlined case (i.e., $f_{c,LINED}=0.9*f_{c,UNLINED}$). The relative electrical permittivity ($\epsilon$) used for the liner 20 will be between $\epsilon_{min,90\%}$ and $\epsilon_{MAX}$.

This reduction in the cutoff frequency by the liner 20 having negative and near zero relative electrical permittivity ($\epsilon$) allows the propagation of waves having lower frequencies in the bore 12 of the TW MRI machines 10, thereby allowing RF travelling-wave excitation and detection to be done at lower Larmor frequencies than what would be required if the liner 20 was not used. This is desirable because it means that large magnetic field strengths that have previously been required for TW MRI machines are no longer required, thereby allowing less expensive magnets to be used by the TW MRI machines. This could also allow existing MRI machines that may have lower strength magnets to be retrofitted to employ TW MRI methods, by providing the existing MRI machine with a liner 20. Alternatively, if the liner 20 having relative electrical permittivity ($\epsilon$) of negative and near zero is used to lower the cutoff frequency of the bore 12, but the field strength used by the TW MRI machine 10 is maintained and the Larmor frequency at which excitation and detection is performed is the same for TW MRI machines that do not have the liner 20, then several modes can be supported by the TW MRI machine 10 and used to carry spatial information (allowing for means of parallel, multidetector imaging) or independently excited/phased signals to further enhance or manipulate RF field uniformity (RF shimming).

The RF frequencies associated with high frequency (HF) MRI, including TW MRI machines are accompanied by short wavelengths, typically 1 meter, as compared with wavelengths of several meters in traditional MRI machines. These shorter wavelengths can create standing waves in the bore of the MRI machine, increasing spatial variation of RF fields in the bore. For example, the $TE_{11}$ mode is described by RF magnetic fields that vary greatly in magnitude between the edges of the bore and the central imaging region. This substantial variation in the field magnitude can result in images with non-uniform intensities. This problem is further exacerbated for higher-order/higher-frequency modes that could have otherwise been exploited for parallel imaging or RF shimming.

When the liner 20 is made up of a metamaterial having a relative electrical permittivity ($\epsilon$) that is negative and near zero, the uniformity of the RF magnetic field across the bore 12 of the TW MRI device 10 is increased. FIGS. 6-9 illustrate the magnitudes of transverse magnetic-field components for the $HE_{11}$ mode for liners having various values of relative electrical permittivity ($\epsilon$). The variation in the RF magnetic field has been calculated using the formula:

$$\text{Variation} = \frac{(H_{MAX,INSIDEBORE} - H_{MIN,INSIDEBORE})}{H_{AVG,NOLINER}} \times 100\%$$

Wherein $H_{MAX, INSIDEBORE}$ is the maximum RF magnetic field strength in the lined bore, $H_{MIN, INSIDEBORE}$ is the minimum RF magnetic field strength in the lined bore and $H_{AVG, NOLINER}$ is the average magnetic field strength inside the unlined bore.

From FIGS. 6-9, it can be seen that the field distributions in the bore are substantially more uniform for negative values of relative electrical permittivity ($\epsilon$) and that the greatest spatial uniformity is observed as electrical permittivity ($\epsilon$) is negative and near zero.

The liner 20 being formed of a metamaterial having a relative electrical permittivity ($\epsilon$) of negative and near zero value can be used to lower the cutoff frequency of the bore 12 of the TW MRI machine 10 and improve the uniformity of fields generate inside the bore 12. While the TW MRI machine 10 could be designed and built with the liner 20 already in place, the liner 20 could be part of a kit to be used with existing MRI machines. The liner 20 could be provided and inserted into the bore of an existing MRI machine. If the existing MRI machine is a high-field (HF) MRI machine (e.g. producing field strengths of 7 T or higher) the liner 20 can be used to improve the uniformity of RF fields in the MRI machine and support more electromagnetic modes in the bore. If the existing MRI machine is a more traditional MRI machine producing lower static magnetic field strengths, the liner 20 can be used to improve the uniformity of the fields in the bore and could be used to allow the MRI machine to be converted to a traveling wave MRI machine by lowering the cutoff frequency of the bore of the MRI machine.

Although the use of a waveguide in the form of a bore 12 in an MRI machine has been discussed, the liner 20 can be used in a number of different types of waveguides to lower the cutoff frequency of the waveguides where electromagnetic waves pass through the waveguide since the bore 12 of the MRI machine is simply a waveguide. In various implementations, waveguides guide electromagnetic waves. In many cases, it may be desirable to lower the cutoff frequency of these waveguides while the waveguides remain substantially hollow. A liner having a main body with an aperture passing through it so that the liner is hollow when inserted in a waveguide can be used. The liner can be made of a metamaterial liner having a relative electrical permittivity ($\epsilon$) of negative and near zero value can be inserted into the waveguide so that the liner lies adjacent to an interior surface of the waveguide without intruding too far into the interior of the waveguide.

This can lower the cutoff frequency for the waveguide and increase the uniformity of fields in the waveguide. Equations, (1), (2) and (3) can be used to determine the properties of the liners, allowing a person to determine $\epsilon_{MAX}$, $\epsilon_{min,90\%}$ and $f_c$ in the same manner discussed herein with regard to MRI bores.

In addition to applications where waveguides need to be hollow, the metamaterial liner may be used in applications to reduce the costs of the metamaterial. Because the present method uses a relatively thin liner to achieve a lowering of the cutoff frequency of a waveguide, the use of the relatively thin liner can reduce the amount of metamaterial used. Because metamaterials tend to be more expensive than typical materials, providing a thin liner can reduce the amount of metamaterial needed and therefore reduce the cost.

Numerous applications can benefit from the use of a metamaterial liner as disclosed herein including: miniaturized waveguide components; horn antennas; waveguide probes; etc. With regard to miniaturized waveguide components, waveguides with small apertures may be made to operate at the same frequencies as waveguides with larger apertures using the metamaterial liner.

With regard to horn antennas, by using a metamaterial liner with a horn antenna, the size of the horn antenna could be reduced. By applying a metamaterial liner as described herein to a horn antenna, the size of a horn antenna could be reduced, yet still allow the horn antenna to function for lower frequencies.

With regard to waveguide probes, waveguides are used as probes in many antenna systems. For example, near-field antenna measurement systems scan waveguide probes in space around antennas-under-test to measure their radiation patterns. In order to receive a substantial amount of the signal, probes must be operated above their cutoff frequency, requiring their aperture sizes to be to be large enough to accommodate the wavelengths to be measured. However, these large probes are unable to measure, with sufficient spatial resolution, electromagnetic phenomena that occur on length scales substantially less than the size of a wavelength. By using a metamaterial liner as outlined within, the metamaterial liner could enable small-aperture waveguide probes to be used to measure fields that would otherwise be cutoff and would therefore also enable measurements of much higher spatial resolution.

The foregoing is considered as illustrative only of the principles of the invention. Further, since numerous changes and modifications will readily occur to those skilled in the art, it is not desired to limit the invention to the exact construction and operation shown and described, and accordingly, all such suitable changes or modifications in structure or operation which may be resorted to are intended to fall within the scope of the claimed invention.

The invention claimed is:

1. A liner for a bore of an MRI machine comprising:
a body having an annular shape and formed of a metamaterial having a relative electrical permittivity that is negative and near zero,
wherein, when the body is provided in the bore, the metamaterial increases uniformity of electric and magnetic fields in the bore and lowers a cutoff frequency for propagating waves in the bore.

2. The liner of claim 1 wherein the relative electrical permittivity of the metamaterial forming the body is substantially −0.1.

3. The liner of claim 2 wherein the relative electrical permittivity of the metamaterial forming the body approaches $\epsilon_{MAX}$ but is less than $\epsilon_{MAX}$, wherein $$\varepsilon_{MAX} = \frac{1 - b^2/a^2}{1 + b^2/a^2},$$

and wherein a is the inner diameter of the liner and b is the outer diameter of the liner.

4. The liner of claim 3 wherein the relative electrical permittivity of the metamaterial forming the body is between $4.3465\epsilon_{MAX}$ and $\epsilon_{MAX}$.

5. The liner of claim 1 wherein the body has an outer diameter having a size that is substantially the same as an inner diameter of the bore of the MM machine.

6. The liner of claim 5 wherein the liner is sized to fit within the bore of the MRI machine and adjacent to an inside surface of the bore of the MM machine.

7. The liner of claim 1 wherein the metamaterial is a negative-refractive-index transmission-line (NRI-TL) metamaterial.

8. The liner of claim 7 wherein the liner is formed of stacks of planar NRI-TL metamaterial layers.

9. The liner of claim 8 wherein the stacks are oriented radially and arranged azimuthally in periodic fashion in the liner and each stack extends a length of the bore.

10. The liner of claim 1 wherein the thickness of the liner decreases a diameter of the bore of the MM machine by 10% or less.

11. The liner of claim 1 wherein the liner is sized to fit within the bore of the MRI machine and adjacent to an inside surface of the bore of the MM machine.

12. A liner for a bore of a waveguide comprising:
a body having an aperture defined therein and formed of a metamaterial having a relative electrical permittivity that is negative and near zero,
wherein, for propagating waves in the bore, the metamaterial decreases a cutoff frequency of the bore relative to the cutoff frequency of the bore without the liner.

13. The liner of claim 12 wherein the relative electrical permittivity of the metamaterial forming the body is substantially −0.1.

14. The liner of claim 12 wherein the relative electrical permittivity of the metamaterial forming the body approaches $\epsilon_{MAX}$ but is less than $\epsilon_{MAX}$, wherein $$\varepsilon_{MAX} = \frac{1 - b^2/a^2}{1 + b^2/a^2},$$

and wherein a is the inner diameter of the liner and b is the outer diameter of the liner.

15. The liner of claim 14 wherein the relative electrical permittivity of the metamaterial forming the body is between $4.3465\epsilon_{MAX}$ and $\epsilon_{MAX}$.

16. The liner of claim 12 wherein the body has an annular shape with an outer diameter having substantially the same size as an inner diameter of the bore of the waveguide.

17. A method of lowering the cutoff frequency of a waveguide having a bore to a reduced cutoff frequency, the method comprising:
selecting the reduced cutoff frequency for the waveguide, the reduced cut off frequency being less than the natural cutoff frequency of the waveguide;
selecting a size of a liner to be used in the bore of the waveguide, the liner formed of a metamaterial;
using the equation, $$f_c = \frac{\sqrt{2}c}{\pi a} \sqrt{\frac{1 - (\varepsilon_{TARGET}/\varepsilon_{MAX})}{1 - 3(\varepsilon_{TARGET}/\varepsilon_{MAX})}}$$

determining $\epsilon_{TARGET}$, wherein $f_c$ is the reduced cutoff frequency, a is the inner diameter of the liner and c is the speed of light in vacuum and $\epsilon_{MAX}$ is determined using the equation, $$\varepsilon_{MAX} = \frac{1 - b^2/a^2}{1 + b^2/a^2}$$

wherein a is the inner diameter of the liner and b is the outer diameter of the liner;
and using a metamaterial to form the liner having a relative electrical permittivity of $\epsilon_{TARGET}$, and
inserting the liner in the bore of the waveguide.

18. The method of claim 17 wherein the waveguide is a bore of an MRI machine.

19. A method of lowering the cutoff frequency of a waveguide, the method comprising:
providing a liner formed of metamaterial having a relative electrical permittivity of negative and near zero value; and
inserting the liner in the waveguide,
wherein the liner is configured and arranged in the waveguide such that the metamaterial in the liner increases uniformity of electric and magnetic fields within the waveguide.

20. The method of claim 19 wherein the relative electrical permittivity of the metamaterial forming the liner is substantially −0.1.

21. The method of claim 19 wherein the relative electrical permittivity of the metamaterial forming the liner is near $\epsilon_{MAX}$ but less than $\epsilon_{MAX}$, wherein $$\varepsilon_{MAX} = \frac{1 - b^2/a^2}{1 + b^2/a^2}$$

and wherein a is the inner diameter of the liner and b is the outer diameter of the liner.

22. The method of claim 21 wherein the relative electrical permittivity of the metamaterial forming the liner is between $4.3465\epsilon_{MAX}$ and $\epsilon_{MAX}$.

23. The method of claim 19 wherein the waveguide is a bore of an MRI machine.

24. The liner of claim 1 wherein the relative electrical permittivity of the metamaterial forming the body is −0.08.

25. The liner of claim 12 wherein the relative electrical permittivity of the metamaterial forming the body is −0.08.

26. The liner of claim 3 wherein the relative electrical permittivity of the metamaterial forming the body is between $1.23105\epsilon_{MAX}$ and $\epsilon_{MAX}$.

* * * * *

UNITED STATES PATENT AND TRADEMARK OFFICE
CERTIFICATE OF CORRECTION

| | | |
|---|---|---|
| PATENT NO. | : 9,529,062 B2 | Page 1 of 2 |
| APPLICATION NO. | : 13/757459 | |
| DATED | : December 27, 2016 | |
| INVENTOR(S) | : Ashwin Iyer et al. | |

It is certified that error appears in the above-identified patent and that said Letters Patent is hereby corrected as shown below:

In the Claims

Column 8, Line 53:
"inner diameter of the bore of the MM machine."
Should read:
--inner diameter of the bore of the MRI machine.--.

Column 8, Line 56:
"surface of the bore of the MM machine."
Should read:
--surface of the bore of the MRI machine.--.

Column 8, Line 66:
"decreases a diameter of the bore of the MM machine by 10%"
Should read:
--decreases a diameter of the bore of the MRI machine by 10%--.

Column 9, Line 3:
"surface of the bore of the MM machine."
Should read:
--surface of the bore of the MRI machine.--.

Signed and Sealed this
Fifth Day of September, 2017

Joseph Matal
*Performing the Functions and Duties of the*
*Under Secretary of Commerce for Intellectual Property and*
*Director of the United States Patent and Trademark Office*

Column 9, Lines 40-45:

"$$f_c = \frac{\sqrt{2}c}{\pi a}\sqrt{\frac{1-(\varepsilon_{TARGET}/\varepsilon_{MAX})}{1-3(\varepsilon_{TARGET}/\varepsilon_{MAX})}}$$"

Should read:

--$$f_c = \frac{2\sqrt{2}c}{\pi a}\sqrt{\frac{1-(\varepsilon_{TARGET}/\varepsilon_{MAX})}{1-3(\varepsilon_{TARGET}/\varepsilon_{MAX})}}$$--.